United States Patent

[11] 3,567,957

[72] Inventor Dwight W. Aten
Washington, N.J.
[21] Appl. No. 810,137
[22] Filed Mar. 25, 1969
[45] Patented Mar. 2, 1971
[73] Assignee The Singer Company
New York, N.Y.

[54] THRESHOLD LOGIC CIRCUITS UTILIZING SERIES CONNECTED TRANSISTORS AND LEVEL SHIFTING DIODES

5 Claims, 5 Drawing Figs.

[52] U.S. Cl. .......... 307/211, 307/203, 307/214, 307/237, 328/92, 307/215, 307/218
[51] Int. Cl. .......... H03k 19/42, H03k 19/44, H03k 5/08
[50] Field of Search .......... 307/203, 204, 207, 209, 211, 214, 215, 218, 219, 237, 239, 303; 328/92

[56] References Cited
UNITED STATES PATENTS
3,056,891 10/1962 Kabell .......... 307/317
3,395,265 7/1968 Weir .......... 307/303

*Primary Examiner*—Donald D. Forrer
*Assistant Examiner*—Larry N. Anagnos
*Attorneys*—Marshall J. Breen and Chester A. Williams, Jr.

ABSTRACT: A string of series-connected transistors having discrete inputs provides a variable clamping voltage to a common junction point by controlling the shunting of individual groups of diodes connected in series with the junction point and ground. An output transistor has its base connected through a series of level-shifting diodes to the common junction point to establish a threshold level. The number of level-shifting diodes is chosen so that when certain ones of the series-connected transistors are saturated, the clamping voltage goes below that necessary to bias the output transistor to conduction and it turns off producing a "1" at the output.

INVENTOR.
Dwight W. Aten

BY Marshall J. Breen
ATTORNEY

WITNESS:
Marvin Rothenberg

INVENTOR.
Dwight W. Aten
BY
Marshall J. Boen
ATTORNEY

WITNESS:
Marvin Rotherberg

THRESHOLD LOGIC CIRCUITS UTILIZING SERIES CONNECTED TRANSISTORS AND LEVEL SHIFTING DIODES

BACKGROUND OF THE INVENTION

While threshold logic circuits are known, they have generally involved the use of current or voltage summing resistors and it has been necessary to hold the value of these resistors to close tolerances to obtain satisfactory operation. For discrete component circuitry this is not difficult to accomplish but in integrated circuits, which are rapidly coming into use, it is desirable to eliminate the need for low tolerance resistors. Multiple diodes and transistors are easily formed in integrated circuits and are to be preferred to resistors where possible.

It is therefore an object of this invention to provide an integrated logic circuit for performing a threshold function in which circuit a minimum number of low tolerance resistors are required.

A further object of this invention is to provide a logic circuit of the above type in which threshold function is performed by a plurality of current switching diodes which can be readily formed by integrated circuitry to have identical characteristics.

Figures 1, 2A, 2B, 2C:
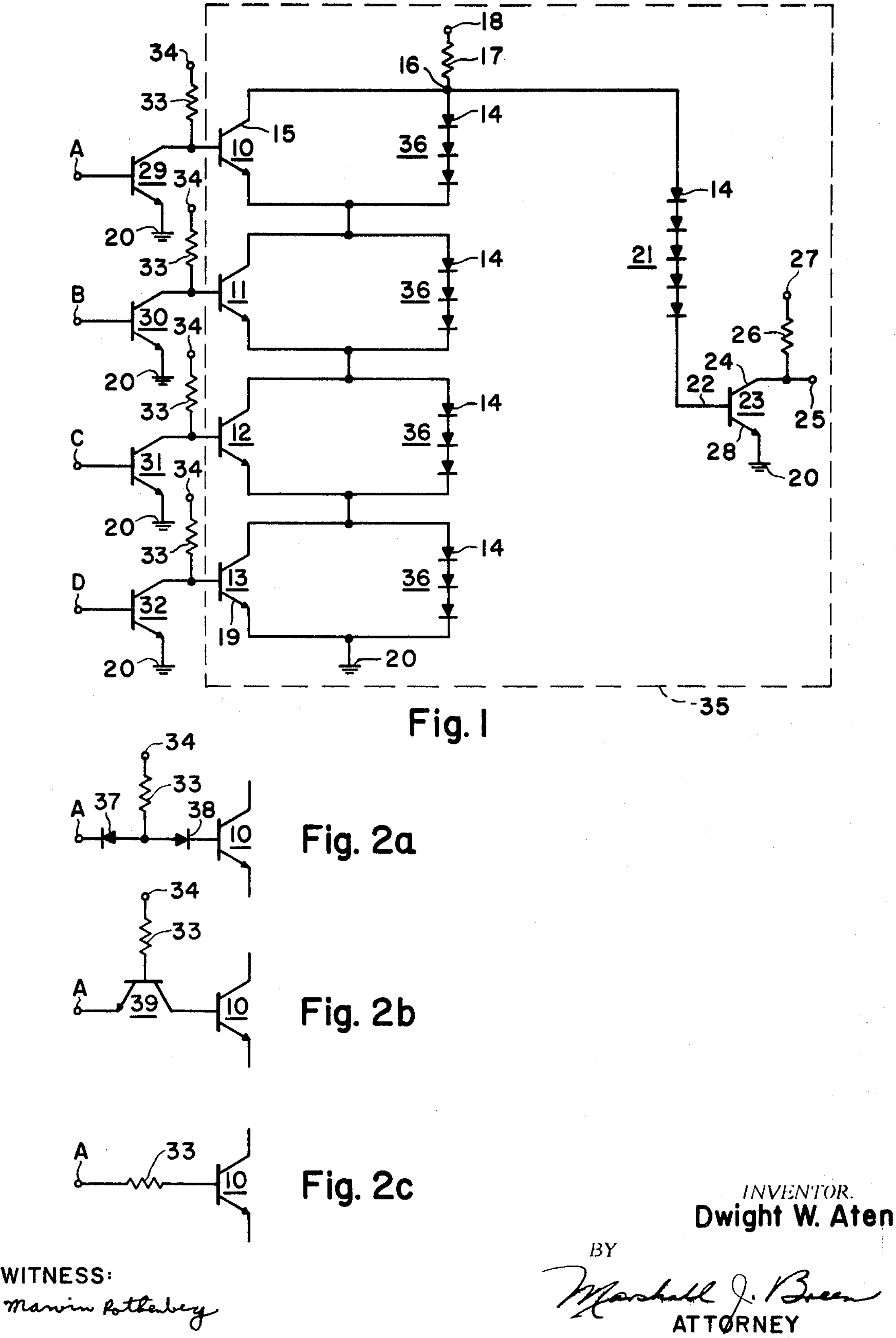
Figure 3:
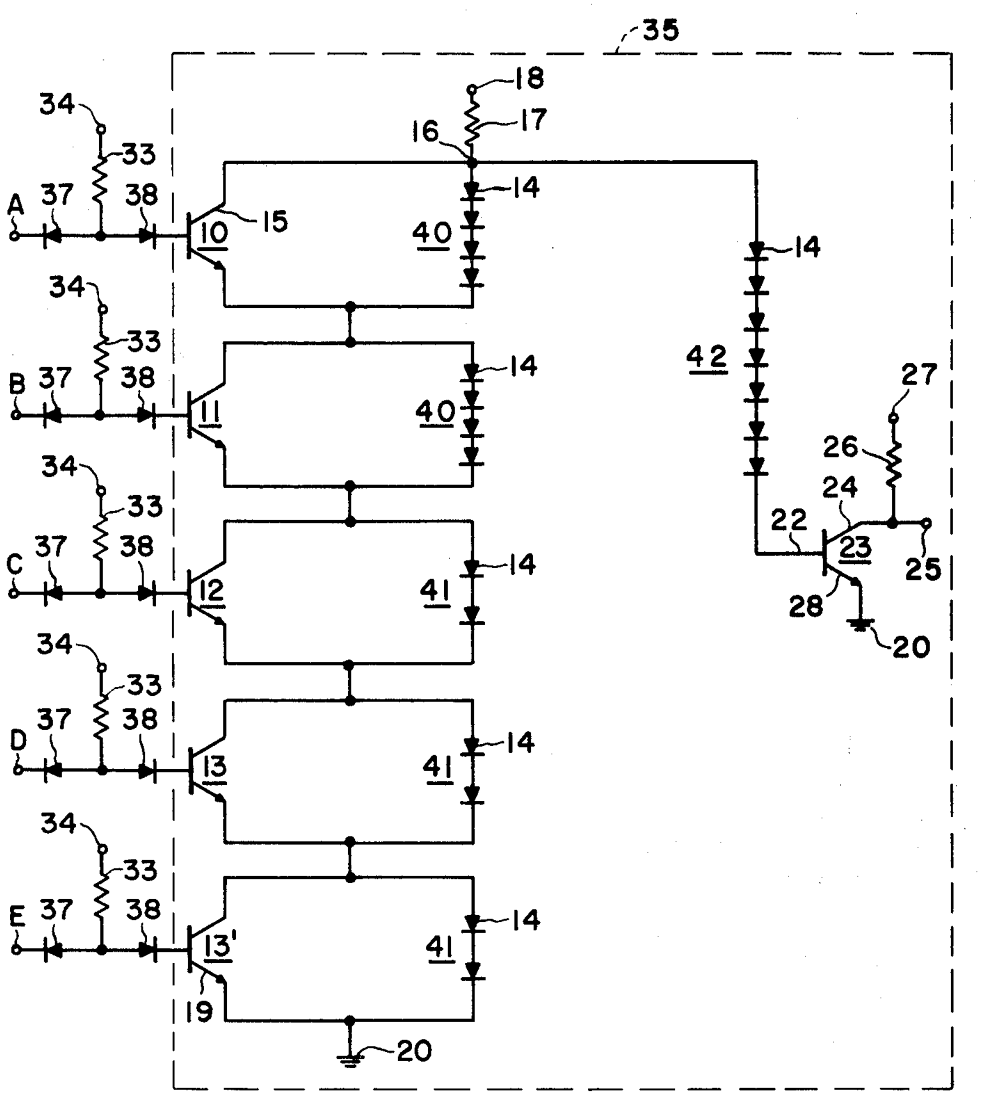

These and other objects of the present invention will become apparent during the course of the following description to be read in view of the drawings, in which:

FIG. 1 shows a circuit schematic of the threshold logic circuit constituting one aspect of the present invention;

FIGS. 2, 2*a*, 2*b*, and 2*c* illustrates how the circuit of FIG. 1 can be adapted for performing a different logical function; and FIG. 3 shows a modification of the circuits of FIGS. 1 and 2 illustrating an embodiment of this invention wherein the inputs have different weights with respect to the threshold function.

DESCRIPTION OF THE INVENTION

A novel threshold logic circuit is shown in FIG. 1 to be comprised of four series-connected similar conductivity type transistors 10, 11, 12 and 13, having their respective collector-emitter terminals shunted by a series string 36 of three diodes 14. The collector 15 of transistor 10 is connected to a common junction 16 and through a resistor 17 to a source of positive potential 18. The emitter 19 of transistor 13 is connected to a point of reference potential which may be circuit ground 20.

The common junction 16 is connected through a series string 21 of five diodes 14 to the base 22 of output transistor 23. The collector 24 is connected to output terminal 25 and through a resistor 26 to a source of positive potential 27. The emitter 28 is connected to circuit ground 20.

Inputs A, B, C, and D are each connected to the base of respective input transistors 29, 30, 31 and 32. The collectors of the input transistors are connected to the respective bases of the transistors 10, 11, 12 and 13 and through individual resistors 33 to a source of positive potential 34. The emitters of transistors 29, 30, 31 and 32 are connected to circuit ground 20.

OPERATION

First of all, it should be noted that the input transistors 29, 30, 31 and 32, provide an inverting function with respect to the inputs only and are not part of the threshold decision circuit itself which latter is indicated by the circuit enclosed by the dashed rectangle 35. As will be seen, other conventional input circuits may be used but the basic operation of the threshold decision circuit remains the same and will be explained with reference to the circuit of FIG. 1.

In the following description certain important assumptions will be made. The collector-emitter voltage of a saturated transistor is low, perhaps 0.2 to 0.3 volts. The forward voltage drop across a discrete diode is typically 0.6 to 0.7 volts. Since these voltage drops are of the same order of magnitude, the saturated transistor collector-emitter drop cannot be ignored. Thus when determination of the proper number of diodes for the various circuits is made, it will be convenient to assume that the collector-emitter drop of a saturated transistor is equal to one-half the forward diode drop. Also the base-emitter drop of a saturated transistor will be assumed as equal to the forward drop of one discrete diode.

Referring to FIG. 1, it will be seen that the voltage of the source 18 and the resistor 17 must be chosen so that the difference between this voltage and the forward voltage across six diodes (five discrete diodes in string 21 plus the base-emitter diode of transistor 23) divided by the resistance 17 gives a value of current sufficient to drive transistor 23 into saturation. Under this condition the voltage at junction 16 will be clamped to a level equal to the forward drops of six diodes, and the output at 25 will be "O." This is the threshold level of the circuit because, when the voltage at 16 is subsequently clamped by the shunting of certain of diode strings 36 by the transistors 10—13 to a level just below this value the output transistor will be cut off and a logical "1" will appear at the output 25.

When all inputs A, B, C and D are high, transistors 10—13 are cut off and place the 12 series-connected diodes 14 effectively between junction 16 and ground. Current will flow in the string 21 and output transistor 23 will be saturated with output "0" at 25. By inspection it will be apparent that at least three of the inputs A, B, and C must go low so that the voltage at 16 is clamped by three discrete diode drops plus three half-diode drops for a total of 4½ diode drops, which is the next possible lower level below the threshold value of six diode drops and the output transistor 23 will be cut off and the output goes to "1."

From the above it will be apparent that for the circuit of FIG. 1 there will be a high output at 25 only when at least three of the four inputs are low. The circuit of FIG. 1 is a three-out-of-four gate with inverting inputs.

While in the circuit of FIG. 1 five diodes are used in string 21 and three diodes are used in strings 36, it is to be understood that, by the teaching of this invention, any desired number of diodes may be used in these strings, the criterion being that the desired threshold level is established by the number of diodes in string 21 plus one. The number of diodes in strings 36 may then be chosen so that the voltage 16 is clamped to the next lower level below the threshold level for any desired input condition.

In terms of Boolean Algebra, the equation of the FIG. 1 threshold circuit may be stated as follows, using the letters $\bar{A}$, $\bar{B}$, $\bar{C}$, and $\bar{D}$ to indicate low input signals and M to indicate a high output signal and with (+) representing the logical OR function while the absence of a symbol between letters represents the logical AND function: (1) $M = \overline{ABC} + \overline{ABD} + \overline{BCD} + \overline{ACD}$ The circuit of FIG. 1 can be altered easily by using non-inverting inputs without affecting the basic operation of the decision circuit. For example, FIG. 2*a* shows an input circuit for transistor 10 having current steering diodes 37 and 38. FIG. 2*b* shows an input circuit for transistor 10 having a transistor 39 in series with the input A and the base of transistor 10. FIG. 2*c* shows an input circuit for transistor 10 having a resistor 40 in series with the input A and the base of transistor 10. It is understood, of course, that the other inputs B, C, and D are similarly connected. It will be seen that for the input circuits of FIG. 2, a low input at A will cutoff off the transistor 10 which is the inverse of the action of the input circuits of FIG. 1. The result is that the circuit of FIG. 1 with inputs as shown in FIG. 2 becomes a threshold gate with noninverting inputs.

In the circuit of FIG. 1, all the inputs have equal weight with respect to their effect on the threshold function as long as they are sufficient to effect switching of the transistors 10—13. That is to say the circuit cannot discriminate between a change in input A and the same change in either input B, C, or D. This is so because the change substitutes the same integral number of diode drops for a half diode drop in each case. If, however, a different number of diodes is associated with the shunting transistors 10—13, a circuit results in which the inputs have different weights with respect to their effect on the threshold function. Such a circuit is shown in FIG. 3 wherein all elements having similar function to those in FIGS. 1 and 2 have the same reference numbers applied thereto.

In the circuit of FIG. 3, transistors 10 and 11 each have a series string 40 of four diodes in shunt with their emitter-collector terminals while transistors 12, 13 and 13′ each have a series string 41 of two diodes in shunt with their emitter-collector terminals. The series string 42 contains seven diodes which with the base-emitter diodes of output transistor 23 establish the threshold at eight diode drops. Thus weighting the threshold at 4, the inputs A and B each have a weight of 2 while inputs C, D and E each have a weight of 1. It will be seen from the above that any combination of the inputs weighted as indicated, which total to the weighted threshold level of 4 will satisfy the criterion that the voltage at 16 is clamped at the next lower level below the threshold level of eight diode drops.

Consider, for example, only inputs A and B as high. The voltage at 16 is then clamped to a value of six diode drops in strings 41 plus one diode drop in the collector-emitter drops of transistors 10 and 11 for a total of seven diode drops. Or consider input A or B as high and any two of the inputs C, D, and E as high. The voltage at 16 is then clamped to a value of four diode drops plus two diode drops plus one and one-half diode drops for a total of seven and one-half drops.

The Boolean equation for the circuit of FIG. 3 is:

(2) $M = AB+(A+B)(CD+CE+DE)$

It will be apparent from the above that the rationale of this invention is as follows:

A string of series-connected transistors having discrete inputs provide a variable maximum clamping voltage to a common junction point by controlling the shunting of individual groups of diodes connected in series with the junction and ground. When any input is such as to drive its associated transistor to saturation, the collector-emitter drop of a saturated transistor is substituted for the summed diode drops of the individual group of diodes so shunted. Thus, as more of the series-connected transistors are driven to saturation by the input signals, the permissible maximum voltage at the common junction is successively lowered. A threshold level is established by a string of series-connected diodes in series with the common junction and the base of an output transistor. When this series string of diodes and the base-emitter diode are forward biased, the voltage at the common junction 16 is clamped to a threshold level equal to the sum of the discrete diode drops plus one. When the permissible maximum voltage at the junction is lowered by the inputs to its next lower value below the threshold level, the output transistor is cut off and a logical "1" appears at the output. The number of diodes and number of inputs may be chosen to establish this change in output signal for any desired input condition.

Obviously, many modifications and variations of the present invention are possible in the light of the above teachings. It is therefore to be understood that within the scope of the appended claims the invention may be practiced otherwise than as specifically described.

I claim:

1. A threshold logic circuit comprising:

a. means deriving a variable maximum permissible voltage level at a junction by individual switching of a plurality of series-connected transistors each having a discrete input;

b. one or more series-connected diodes connected in shunt with the collector-emitter terminals of each transistor;

c. a threshold level detector including a predetermined number of series-connected level-shifting diodes connected between said junction and the base of an output transistor; and d. means adjusting the number of series-connected diodes in shunt with the collector-emitter terminals to establish a maximum permissible voltage level at the junction just below the threshold level set by the level shifting diodes for any desired condition of the discrete inputs.

2. A threshold logic circuit comprising:

a. a first string of series-connected diodes connected in series with a single impedance across a source of potential, said diodes being poled in a direction to permit forward current flow;

b. means providing controlled shunting of said diodes in integrally numbered groups; including c. a plurality of transistors each having a base adapted to receive an individual input signal and having a collector-emitter path in shunt with one of said integrally numbered groups of diodes;

d. an output transistor connected in the common emitter configuration;

e. a second string of series-connected diodes connected between the junction formed by said impedance with said first string of diodes and the base of said output transistor, said second string of diodes being poled in a direction to conduct forward base current for the output transistor; and f. an output terminal connected to the collector of the output transistor.

3. A threshold logic circuit comprising:

a plurality of transistors of like polarity having their collector-emitter paths connected in mutual series and through a common impedance to a source of biasing potential;

b. base electrodes for said transistors each adapted to receive an individual input signal to selectively permit or prevent conduction in each transistor;

c. one or more series-connected diodes connected across the collector-emitter terminals of each transistor;

d. a single output transistor having a base, a collector and an emitter;

e. a plurality of series-connected diodes connected between said last-named base and through said common impedance to said source of biasing potential;

f. an output terminal connected to said last-named collector; and g. a second impedance connected between said last-named collector and a source of biasing potential.

4. A threshold logic circuit comprising:

a. a plurality of transistors of like polarity having their collector-emitter paths connected in series with each other between a junction and a point of reference potential;

b. a first impedance connected between said junction and a source of biasing potential;

c. base electrodes for said transistors each adapted to receive an individual input signal to selectively permit or prevent conduction in each transistor;

d. one or more series-connected diodes connected across the collector-emitter terminals of each transistor;

e. a single output transistor having a base, a collector and an emitter;

f. a plurality of series-connected diodes connected between said junction and said last-named base, said diodes being poled in a direction to conduct forward base current for said output transistor;

g. an output terminal connected to said last-named collector;

h. a second impedance connected between said last-named collector and a source of biasing potential; and i. means connecting said last-named emitter to said point of reference potential.

5. A threshold logic circuit as set forth in claim 4, wherein a different number of series diodes are connected across the collector-emitter terminals of the transistors to provide different weights to the inputs with respect to their effect on the threshold function.